(12) United States Patent
Zhang et al.

(10) Patent No.: US 11,514,999 B2
(45) Date of Patent: Nov. 29, 2022

(54) SYSTEMS AND METHODS FOR PARAMETRIC PV-LEVEL MODELING AND READ THRESHOLD VOLTAGE ESTIMATION

(71) Applicant: SK hynix Inc., Gyeonggi-do (KR)

(72) Inventors: Fan Zhang, Fremont, CA (US); Aman Bhatia, Los Gatos, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/233,167

(22) Filed: Apr. 16, 2021

(65) Prior Publication Data
US 2022/0336039 A1     Oct. 20, 2022

(51) Int. Cl.
| | |
|---|---|
| *G11C 29/50* | (2006.01) |
| *G11C 16/04* | (2006.01) |
| *G06N 3/04* | (2006.01) |
| *G11C 16/26* | (2006.01) |
| *G06F 11/10* | (2006.01) |
| *G11C 16/34* | (2006.01) |

(52) U.S. Cl.
CPC .... *G11C 29/50004* (2013.01); *G06F 11/1072* (2013.01); *G06N 3/04* (2013.01); *G11C 16/0483* (2013.01); *G11C 16/26* (2013.01); *G11C 16/3404* (2013.01)

(58) Field of Classification Search
None
See application file for complete search history.

(56) References Cited

U.S. PATENT DOCUMENTS

| | | | |
|---|---|---|---|
| 8,116,141 | B2 | 2/2012 | Yoo et al. |
| 8,369,141 | B2 | 2/2013 | Sommer et al. |
| 8,605,502 | B1 | 12/2013 | Desireddi |
| 8,885,415 | B2 | 11/2014 | Chilappagari et al. |
| 8,898,553 | B1 | 11/2014 | Varnica et al. |
| 8,913,437 | B2 | 12/2014 | Chilappagari et al. |
| 8,990,665 | B1 | 3/2015 | Steiner et al. |
| 9,069,659 | B1 | 6/2015 | Sabbag et al. |
| 9,330,775 | B2 | 5/2016 | Kim et al. |
| 9,542,258 | B1 | 1/2017 | Lu et al. |
| 9,589,673 | B1 | 3/2017 | Zhang et al. |

(Continued)

OTHER PUBLICATIONS

Wang, C., et al., DNN-aided Read-voltage Threshold Optimization for MLC Flash Memory with Finite Block Length, Apr. 11, 2020, p. 1-10, arXiv:2004.05340 [cs.IT].

(Continued)

*Primary Examiner* — Guerrier Merant
(74) *Attorney, Agent, or Firm* — IP & T Group LLP

(57) ABSTRACT

Embodiments provide a scheme for parametric PV-level modeling and an optimal read threshold voltage estimation in a memory system. A controller performs read operations on cells using read threshold voltages; generates CMF samples based on the read operations; and receives first and second CDF values, which correspond to CMF samples, each CDF value representing a skew normal distribution. The controller estimates first and second probability distribution parameter sets corresponding to the first and second CDF values, respectively; determines first and second PDF values using the first and second probability distribution parameter sets, respectively; and estimates, as an optimal read threshold voltage, a read threshold voltage corresponding to a cross-point of the first and second PDF values.

18 Claims, 15 Drawing Sheets

(56) References Cited

U.S. PATENT DOCUMENTS

| | | |
|---|---|---|
| 9,728,263 B2 | 8/2017 | Sharon et al. |
| 9,905,289 B1 | 2/2018 | Jeon et al. |
| 10,216,422 B2 | 2/2019 | Kim et al. |
| 10,236,067 B2 | 3/2019 | Fisher et al. |
| 10,276,247 B2 | 4/2019 | Alhussien et al. |
| 10,290,358 B2 | 5/2019 | Alhussien et al. |
| 10,573,389 B2 | 2/2020 | Kim et al. |
| 10,726,934 B2 | 7/2020 | Chew et al. |
| 10,877,827 B2 | 12/2020 | Miladinovic |
| 2010/0149872 A1 | 6/2010 | Aoyagi |
| 2011/0228583 A1 | 9/2011 | Noguchi et al. |
| 2012/0236638 A1 | 9/2012 | Weingarten et al. |
| 2013/0176775 A1 | 7/2013 | Tang et al. |
| 2016/0103763 A1 | 4/2016 | Chen et al. |
| 2017/0076807 A1 | 3/2017 | Asami et al. |
| 2019/0004734 A1 | 1/2019 | Kirshenbaum et al. |
| 2019/0026076 A1 | 1/2019 | Leng et al. |
| 2019/0115078 A1 | 4/2019 | Kim et al. |
| 2019/0156180 A1 | 5/2019 | Nomura et al. |
| 2019/0172542 A1 | 6/2019 | Miladinovic |
| 2019/0279728 A1 | 9/2019 | Kodama et al. |
| 2019/0340062 A1 | 11/2019 | Cai et al. |
| 2020/0066353 A1 | 2/2020 | Pletka et al. |
| 2020/0210096 A1 | 7/2020 | Kim et al. |
| 2020/0210831 A1 | 7/2020 | Zhang et al. |
| 2020/0234772 A1 | 7/2020 | Halperin et al. |
| 2020/0265903 A1 | 8/2020 | Kim et al. |
| 2020/0303016 A1 | 9/2020 | Amada |
| 2021/0082528 A1 | 3/2021 | Takizawa et al. |
| 2021/0264983 A1 | 8/2021 | Lemke et al. |
| 2021/0375364 A1 | 12/2021 | Liikanen et al. |

OTHER PUBLICATIONS

Office Action issued by the USPTO of U.S. Appl. No. 17/011,983 dated Jul. 29, 2021.
Notice of Allowance issued by the USPTO dated Mar. 8, 2022.
Office Action issued by the USPTO for U.S. Appl. No. 16/927,567 dated Jan. 5, 2022.
Office Action for U.S. Appl. No. 16/927,567 issued by the USPTO dated Jun. 29, 2022.
Office Action issued by the USPTO for U.S. Appl. No. 16/927,567 dated Aug. 31, 2021.
Non-final Office Action issued by United States Patent and Trademark Office for the U.S. Appl. No. 17/443,726 dated Oct. 11, 2022.

SYSTEMS AND METHODS FOR PARAMETRIC PV-LEVEL MODELING AND READ THRESHOLD VOLTAGE ESTIMATION

BACKGROUND

1. Field

Embodiments of the present disclosure relate to a scheme for determining an optimal read threshold voltage in a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs). Memory systems may determine an optimal read threshold voltage among read threshold voltages according to various schemes.

SUMMARY

Aspects of the present invention include a system and a method for parametric PV-level modeling and an optimal read threshold voltage estimation based on the parametric PV-level modeling.

In one aspect, a memory system includes a memory device including a plurality of cells and a controller. The controller performs read operations on the cells using a plurality of read threshold voltages; generate cumulative mass function (CMF) samples based on the results of the read operations; receives first and second cumulative distribution function (CDF) values, selected from among a plurality of CDF values, which correspond to the CMF samples, each of the first and second CDF values representing a skew normal distribution; estimates first and second probability distribution parameter sets corresponding to the first and second CDF values, respectively; determine first and second probability density function (PDF) values corresponding to the first and second CDF values using the first and second probability distribution parameter sets, respectively; and estimate, as an optimal read threshold voltage, a read threshold voltage corresponding to a cross-point of the first and second PDF values.

In another aspect, a method for operating a memory system, which includes a memory device including a plurality of cells and a controller, includes: performing read operations on the cells using a plurality of read threshold voltages; generating cumulative mass function (CMF) samples based on the results of the read operations; receiving first and second cumulative distribution function (CDF) values, selected from among a plurality of CDF values, which correspond to the CMF samples, each of the first and second CDF values representing a skew normal distribution; estimating first and second probability distribution parameter sets corresponding to the first and second CDF values, respectively; determine first and second probability density function (PDF) values corresponding to the first and second CDF values using the first and second probability distribution parameter sets, respectively; and estimating, as an optimal read threshold voltage, a read threshold voltage corresponding to a cross-point of the first and second PDF values.

Additional aspects of the present invention will become apparent from the following description.

DETAILED DESCRIPTION

Figure 1:
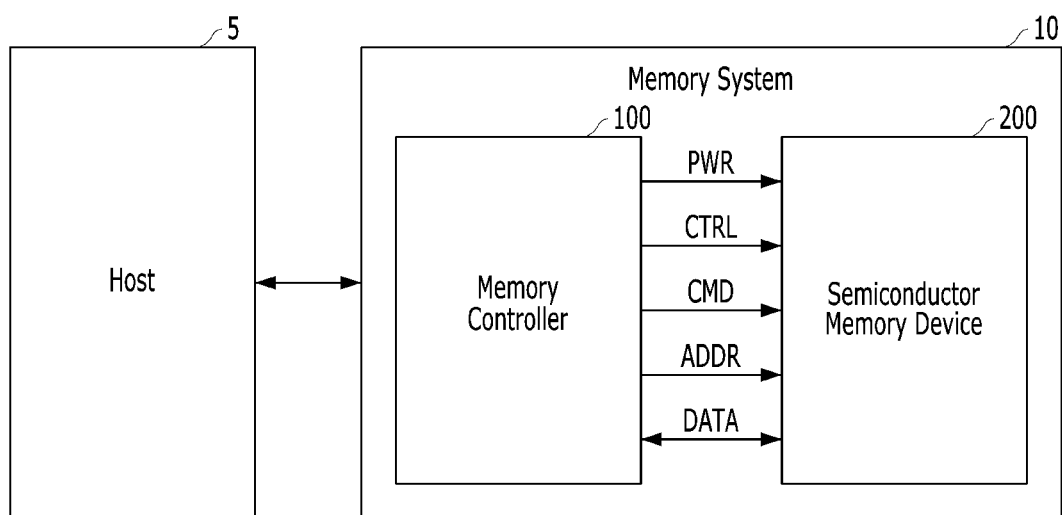
FIG. 1 is a block diagram illustrating a data processing system.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). The term "embodiments" as used herein does not necessarily refer to all embodiments. Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any one of various kinds of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any one of various kinds of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operation of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
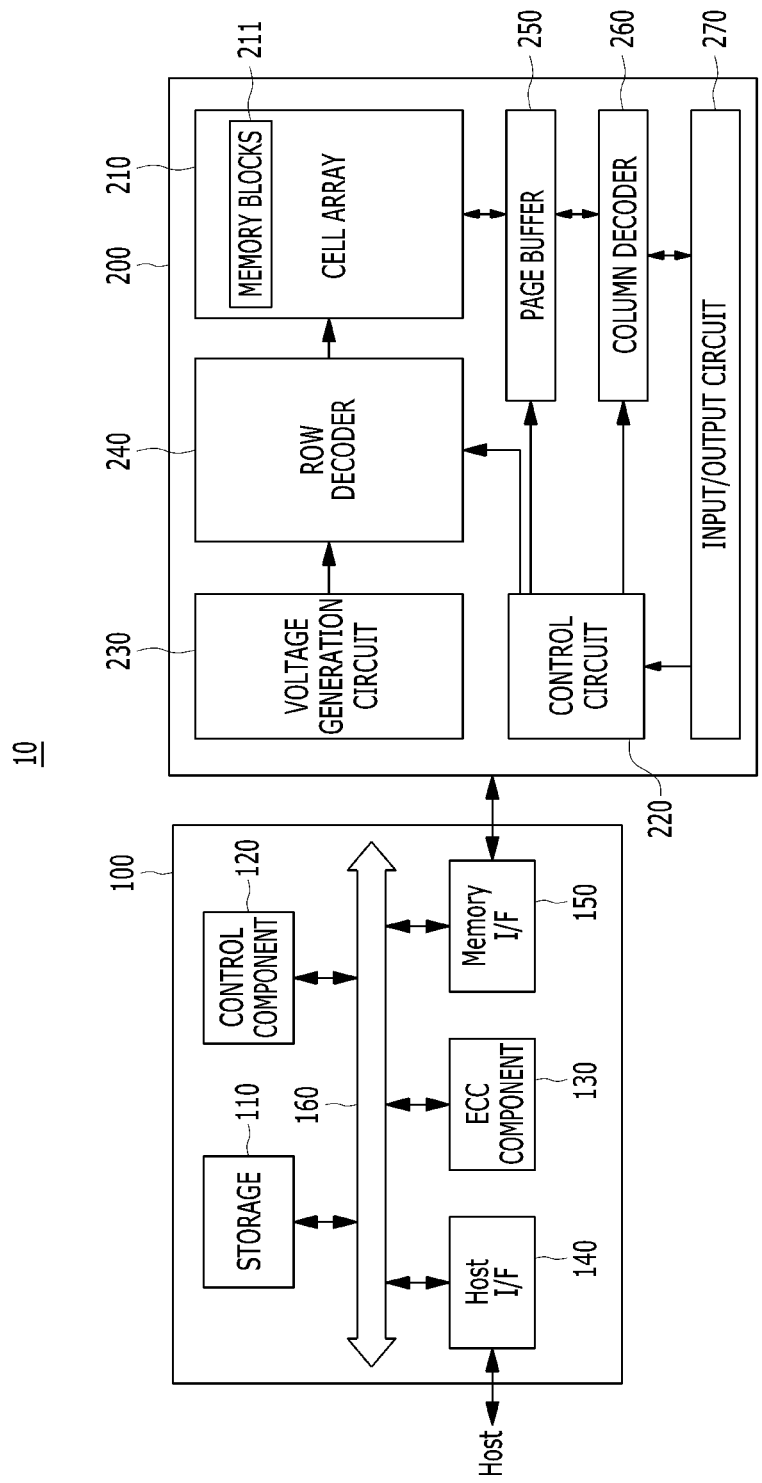
FIG. 2 is a block diagram illustrating a memory system.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
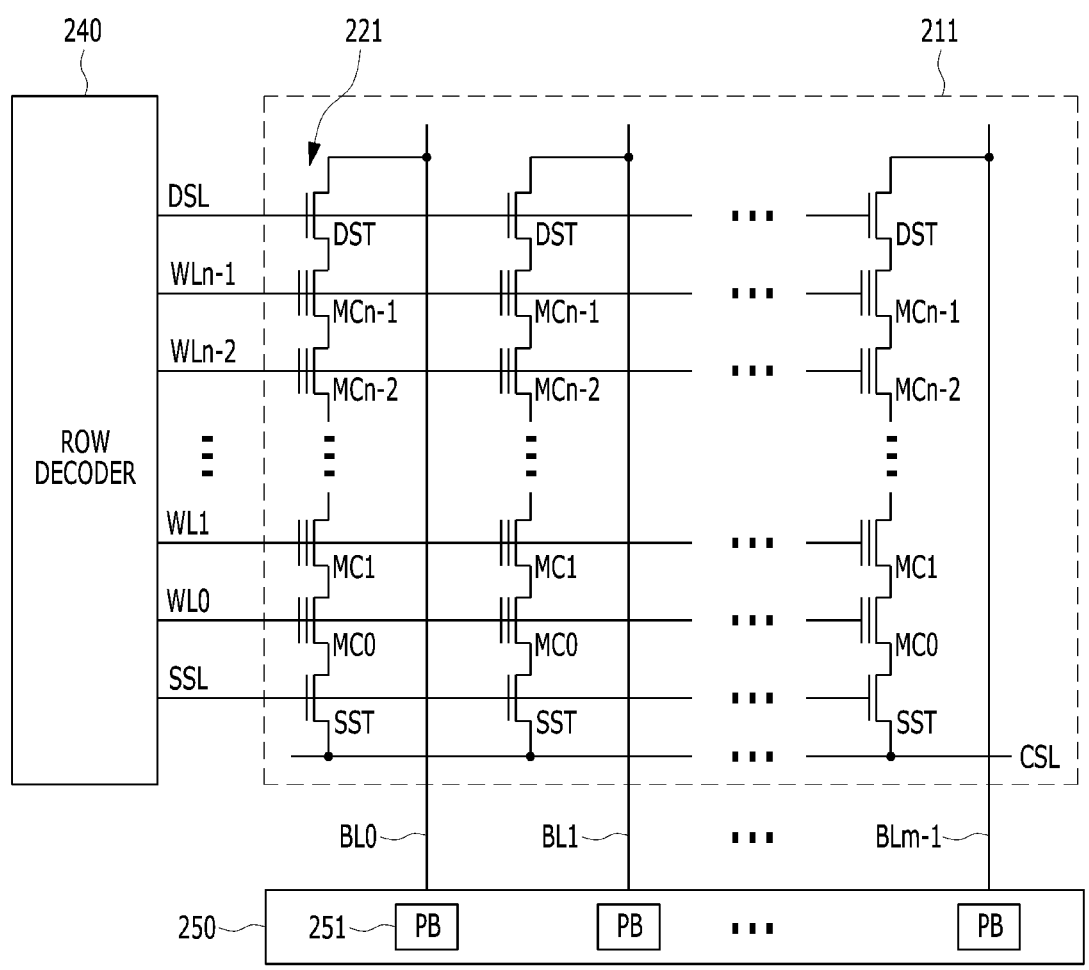
FIG. 3 is a circuit diagram illustrating a memory block of a memory device.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250. The column decoder 260 may also interface with the input/output circuit 270, transmitting data to, and receiving data from it.

The input/output circuit 270 may transmit to the control circuit 220 a command and an address, received from an external device (e.g., the memory controller 100 of FIG. 1), transmit data from the external device to the column decoder 260, and/or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn−1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a single level cell (SLC) storing 1 bit of data, a multi-level cell (MLC) storing 2 bits of data, a triple-level cell (TLC) storing 3 bits of data, or a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 may temporarily store data received through the bit lines BL0 to BLm−1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
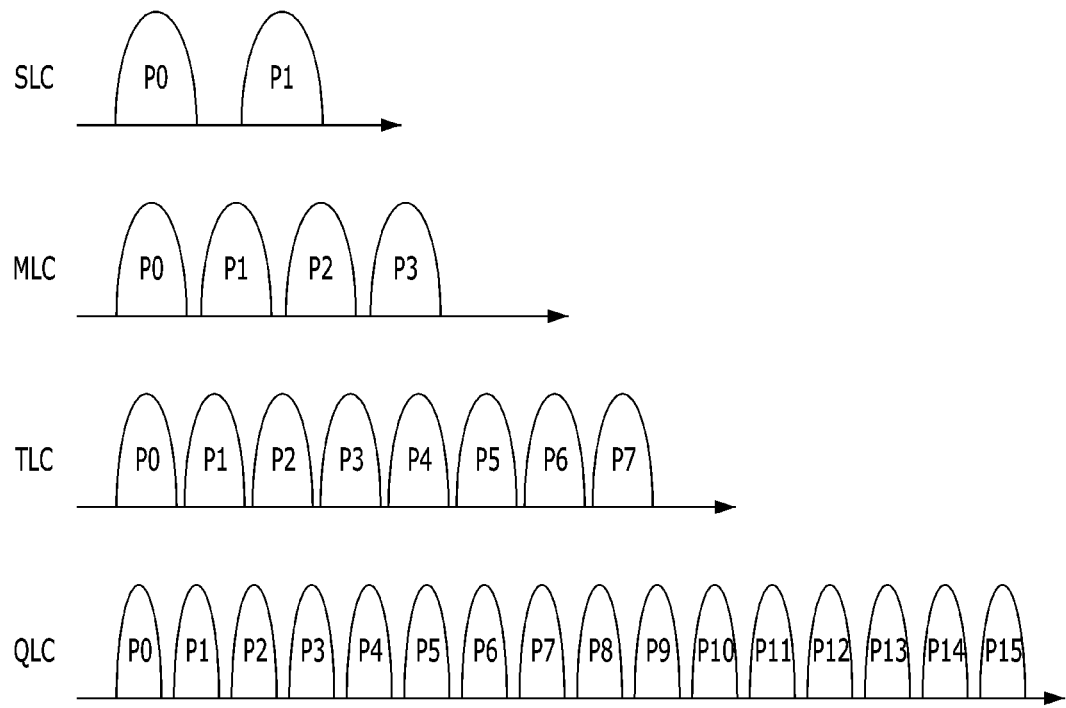
FIG. 4 is a diagram illustrating distributions of states for different types of cells of a memory device.

FIG. 4 is a diagram illustrating distributions of states or program voltage (PV) levels for different types of cells of a memory device.

Referring to FIG. 4, each of memory cells may be implemented with a specific type of cell, for example, a single level cell (SLC) storing 1 bit of data, a multi-level cell (MLC) storing 2 bits of data, a triple-level cell (TLC) storing 3 bits of data, or a quadruple-level cell (QLC) storing 4 bits of data. Usually, all memory cells in a particular memory device are of the same type, but that is not a requirement.

An SLC may include two states P0 and P1. P0 may indicate an erase state, and P1 may indicate a program state. Since the SLC can be set in one of two different states, each SLC may program or store 1 bit according to a set coding method. An MLC may include four states P0, P1, P2 and P3. Among these states, P0 may indicate an erase state, and P1 to P3 may indicate program states. Since the MLC can be set in one of four different states, each MLC may program or store two bits according to a set coding method. A TLC may include eight states P0 to P7. Among these states, P0 may indicate an erase state, and P1 to P7 may indicate program states. Since the TLC can be set in one of eight different states, each TLC may program or store three bits according to a set coding method. A QLC may include 16 states P0 to P15. Among these states, P0 may indicate an erase state, and P1 to P15 may indicate program states. Since the QLC can be set in one of sixteen different states, each QLC may program or store four bits according to a set coding method.

Referring back to FIGS. 2 and 3, the memory device 200 may include a plurality of memory cells (e.g., NAND flash memory cells). The memory cells are arranged in an array of rows and columns as shown in FIG. 3. The cells in each row are connected to a word line (e.g., WL0), while the cells in each column are coupled to a bit line (e.g., BL0). These word and bit lines are used for read and write operations. During a write operation, the data to be written ('1' or '0') is provided at the bit line while the word line is asserted. During a read operation, the word line is again asserted, and the threshold voltage of each cell can then be acquired from the bit line. Multiple pages may share the memory cells that belong to (i.e., are coupled to) the same word line. When the memory cells are MLCs, the multiple pages include a most significant bit (MSB) page and a least significant bit (LSB) page. When the memory cells are TLCs, the multiple pages include an MSB page, a center significant bit (CSB) page and an LSB page. When the memory cells are QLCs, the multiple pages include an MSB page, a center most significant bit (CMSB) page, a center least significant bit (CLSB) page and an LSB page. The memory cells may be programmed using a coding scheme (e.g., Gray coding) in order to increase the capacity of the memory system 10 such as SSD.

Figure 5A:
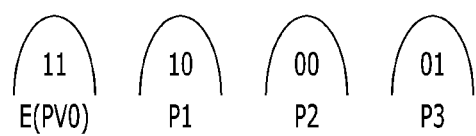
FIG. 5A is a diagram illustrating an example of Gray coding for a multi-level cell (MLC).

FIG. 5A is a diagram illustrating an example of coding for a multi-level cell (MLC).

Referring to FIG. 5A, an MLC may be programmed using a set type of coding. An MLC may have 4 program states, which include an erased state E (or PV0) and a first program state PV1 to a third program state PV3. The erased state E (or PV0) may correspond to "11." The first program state PV1 may correspond to "10." The second program state PV2 may correspond to "00." The third program state PV3 may correspond to "01."

Figure 5B:
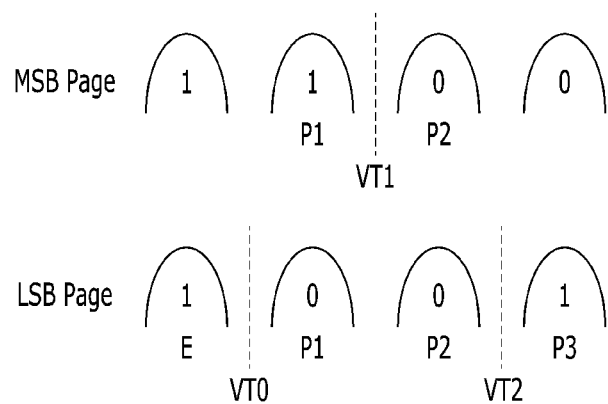
FIG. 5B is a diagram illustrating state distributions for pages of a multi-level cell (MLC).

In the MLC, as shown in FIG. 5B, there are 2 types of pages: LSB and MSB pages. 1 or 2 thresholds may be applied in order to retrieve data from the MLC. For an MSB page, the single threshold value is VT1. VT1 distinguishes between the first program state PV1 and the second program state PV2. For an LSB page, there are two thresholds: VT0 and VT2. VT0 distinguishes between the erased state E and the first program state PV1. VT2 distinguishes between the second program state PV2 and the third program state PV3.

Figure 6A:
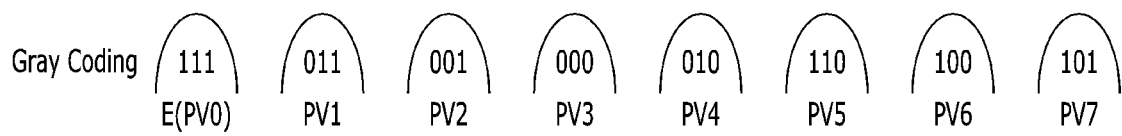
FIG. 6A is a diagram illustrating an example of Gray coding for a triple-level cell (TLC).

FIG. 6A is a diagram illustrating an example of Gray coding for a triple-level cell (TLC).

Referring to FIG. 6A, a TLC may be programmed using Gray coding. A TLC may have 8 program states, which include an erased state E (or PV0) and a first program state PV1 to a seventh program state PV7. The erased state E (or PV0) may correspond to "111." The first program state PV1 may correspond to "011." The second program state PV2 may correspond to "001." The third program state PV3 may correspond to "000." The fourth program state PV4 may correspond to "010." The fifth program state PV5 may correspond to "110." The sixth program state PV6 may correspond to "100." The seventh program state PV7 may correspond to "101."

Figure 6B:
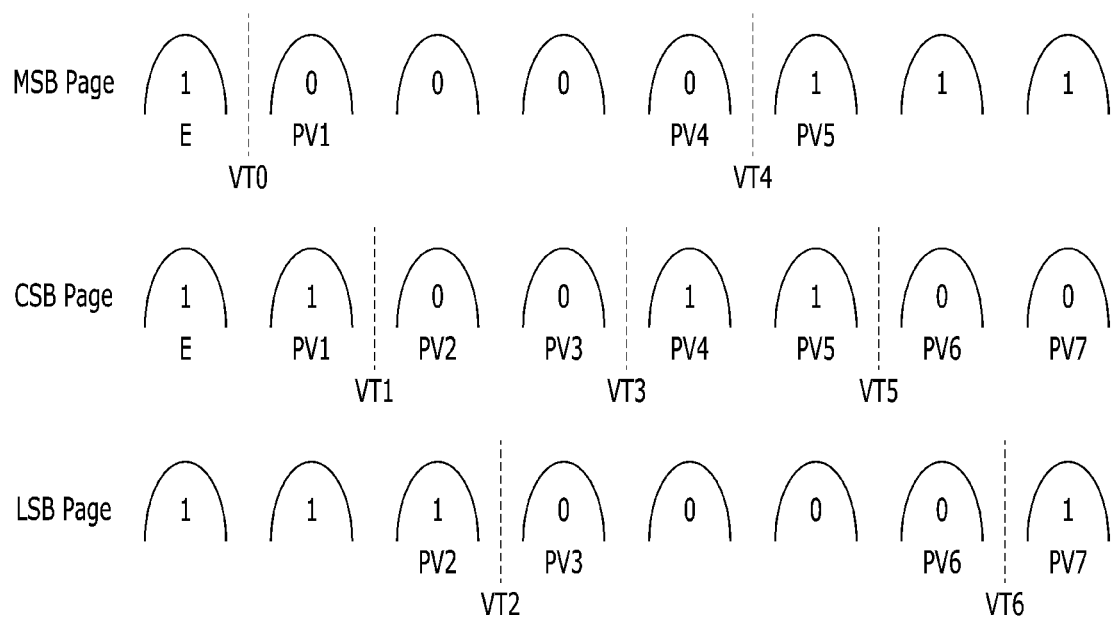
FIG. 6B is a diagram illustrating state distributions for pages of a triple-level cell (TLC).

In the TLC, as shown in FIG. 6B, there are 3 types of pages: LSB, CSB and MSB pages. 2 or 3 thresholds may be applied in order to retrieve data from the TLC. For an MSB page, there are two thresholds: VT0 that distinguishes between an erase state E and a first program state PV1 and VT4 that distinguishes between a fourth program state PV4 and a fifth program state PV5. For a CSB page, there are three thresholds: VT1, VT3 and VT5. VT1 distinguishes between a first program state PV1 and a second program state PV2. VT3 distinguishes between a third program state PV3 and the fourth program state PV4. VT5 distinguishes between the fourth program state PV5 and the sixth program state PV6. For an LSB page, there are two thresholds: VT2 and VT6. VT2 distinguishes between the second program state PV2 and the third program state PV3. VT6 distinguishes between the sixth program state PV6 and a seventh program state PV7.

After a memory array including a plurality of memory cells is programmed as described in FIGS. 5A and 6A, when a read operation is performed on the memory array using a certain reference voltage such as a read threshold voltage (also called "read voltage level" or "read threshold"), the electrical charge levels of the memory cells (e.g., threshold voltage levels of transistors of memory cells) are compared to one or more reference voltages to determine the state of individual memory cells. When a certain read threshold is applied to the memory array, those memory cells that have threshold voltage levels higher than the certain reference voltage are turned on and detected as "on" cell, whereas those memory cells that have threshold voltage levels lower than the certain reference voltage are turned off and detected as "off" cell, for example. Therefore, each read threshold is arranged between neighboring threshold voltage distribution windows corresponding to different programmed states so that each read threshold can distinguish such programmed states by turning on or off the memory cell transistors.

When a read operation is performed on memory cells in a data storage device using MLC technology, the threshold voltage levels of the memory cells are compared to more than one read threshold to determine the state of individual memory cells. Read errors can be caused by distorted or overlapped threshold voltage distributions. An ideal memory cell threshold voltage distribution can be significantly distorted or shifted to overlap with a neighboring threshold voltage distribution due to, e.g., program and erase (P/E) cycles, cell-to-cell interference, and/or data retention errors. For example, as program/erase cycles increase, the margin between neighboring threshold voltage distributions of different programmed states decreases and eventually the distributions overlap. As a result, the memory cells with threshold voltages that fall within the overlapping regions of the neighboring distributions may be read as being programmed to a value other than the original targeted value and thus cause read errors. Such read errors may be managed in most situations by using error correction codes (ECC). When the number of bit errors on a read operation exceeds the ECC correction capability of the data storage, the read operation using a set read threshold voltage fails. The set read threshold voltage may be a previously used read threshold voltage (i.e., history read threshold voltage). The history read threshold voltage may be the read threshold voltage used in the last successful decoding, that is, a read voltage used in a read-passed read operation performed before any read retry operation is performed. When the read operation using the set read threshold voltage failed, the controller 120 may control performance of an error recovery algorithm as shown in FIG. 7.

Figure 7:
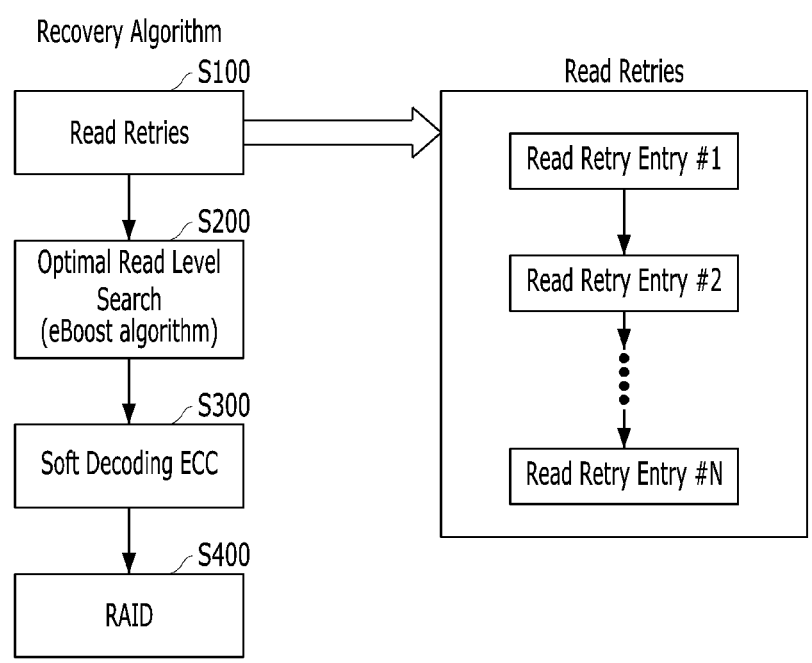
FIG. 7 is a diagram illustrating a flow of an error recovery algorithm in a memory system.

Referring to FIG. 7, the controller 120 may perform one or more read retry operations for the memory cells using one or more read threshold voltages applied in a set order (S100). For example, there may be N (e.g., N is 5 or 10) read threshold voltages (or read voltage levels) including a first read threshold voltage to an Nth read threshold voltage. The first read threshold voltage may be a previously used read threshold voltage (i.e., history read threshold voltage). The history read threshold voltage may be the read threshold voltage used in the last successful decoding, that is, a read voltage used in a last read-passed read operation performed before any read retry operation. The controller 120 may perform the read retry operations until it is determined that decoding associated with a corresponding read retry operation is successful.

When all read retry operations using the read threshold voltages failed, the controller 120 may perform additional recovery operations. For example, the additional recovery operations may include an optimal read threshold voltage search (S200), a soft decoding using an error correction code (ECC) (S300) and a redundant array of independent disks (RAID) recovery (S400).

As described above, in memory systems such as NAND flash storage systems, after a read command is received, a sequence of data recovery steps is executed with the aim of retrieving the noise-free data from a memory device (i.e., NAND flash memory device). In the first attempt, a read operation using the history read threshold voltage (i.e., a history read) is performed. Each physical block may maintain its own history read, which may be updated if decoding associated with the history read fails. If the history read fails, one or more read retry attempts are performed, such attempts being generally referred to as a high priority read retry (HRR. HRR is a series of read threshold voltages (i.e., Vt) that remain the same throughout the process. The HRR read retry threshold voltages do not change in response to a change in NAND condition, nor are they dependent on the physical location of data to be read. Typically, 5 to 10 HRR read attempts are made. If all HRR read attempts fail, an optimal read threshold voltage is found through the optimal read level search (i.e., an eBoost algorithm) and a soft read and soft decoding operation is then performed with the optimal read threshold voltage. The eBoost algorithm may perform multiple reads to find the best center Vt for soft read. There are many different eBoost algorithms such as Gaussian Modeling (GM), cumulative cell count search (CCS) and advanced valley search (AVA) algorithms.

Figure 8:
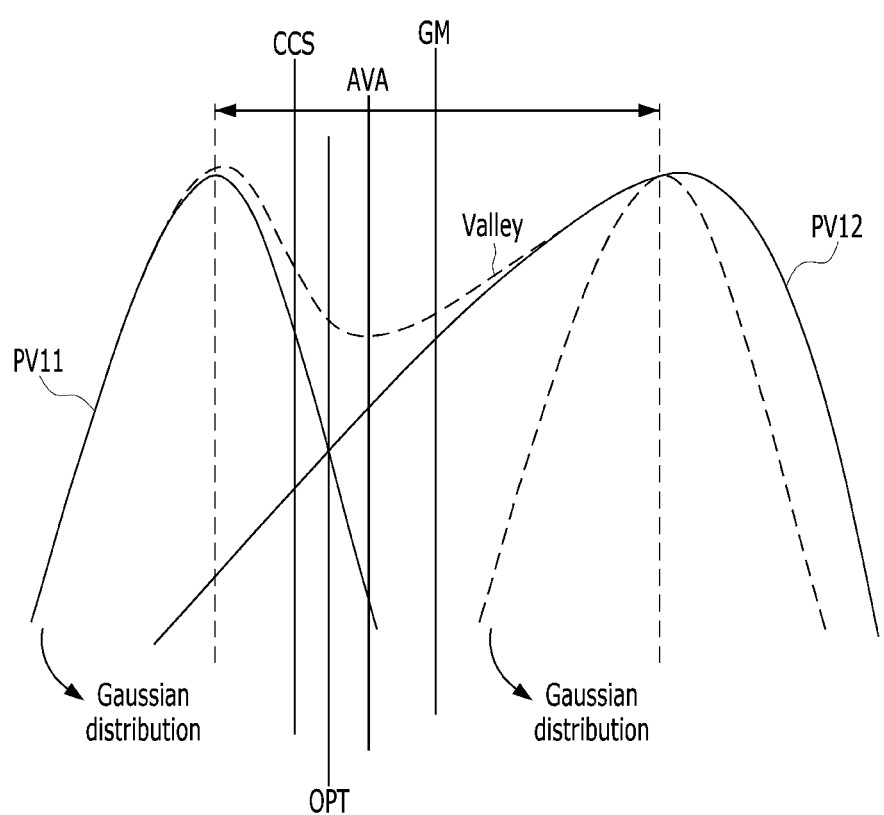
FIG. 8 is a diagram illustrating an operation for estimating an optimal read threshold voltage by various eBoost algorithms.

FIG. 8 is a diagram illustrating an operation for estimating an optimal read threshold voltage by various eBoost algorithms such as GM, CCS and AVA algorithms.

Referring to FIG. 8, a read threshold voltage obtained by each of GM, CCS and AVA algorithms is shown in comparison with an optimal read threshold voltage OPT. GM algorithm tries to find a read threshold voltage (Vt) assuming that all PV states (i.e., PV11, PV12) follow a Gaussian distribution with known/constant variance and unknown means. CCS algorithm tries to find Vt such that the number of cells on each side of Vt are equal. AVA is trying to find the lowest point in a valley of the distribution, as Vt. As shown in FIG. 8, when one (e.g., PV12) of two PV states is asymmetric and has a heavier tail than the others, each of these algorithms may estimate a read threshold voltage (i.e., GM, CCS, AVA) that is offset or biased from the optimal read threshold voltage OPT.

Figure 9A:
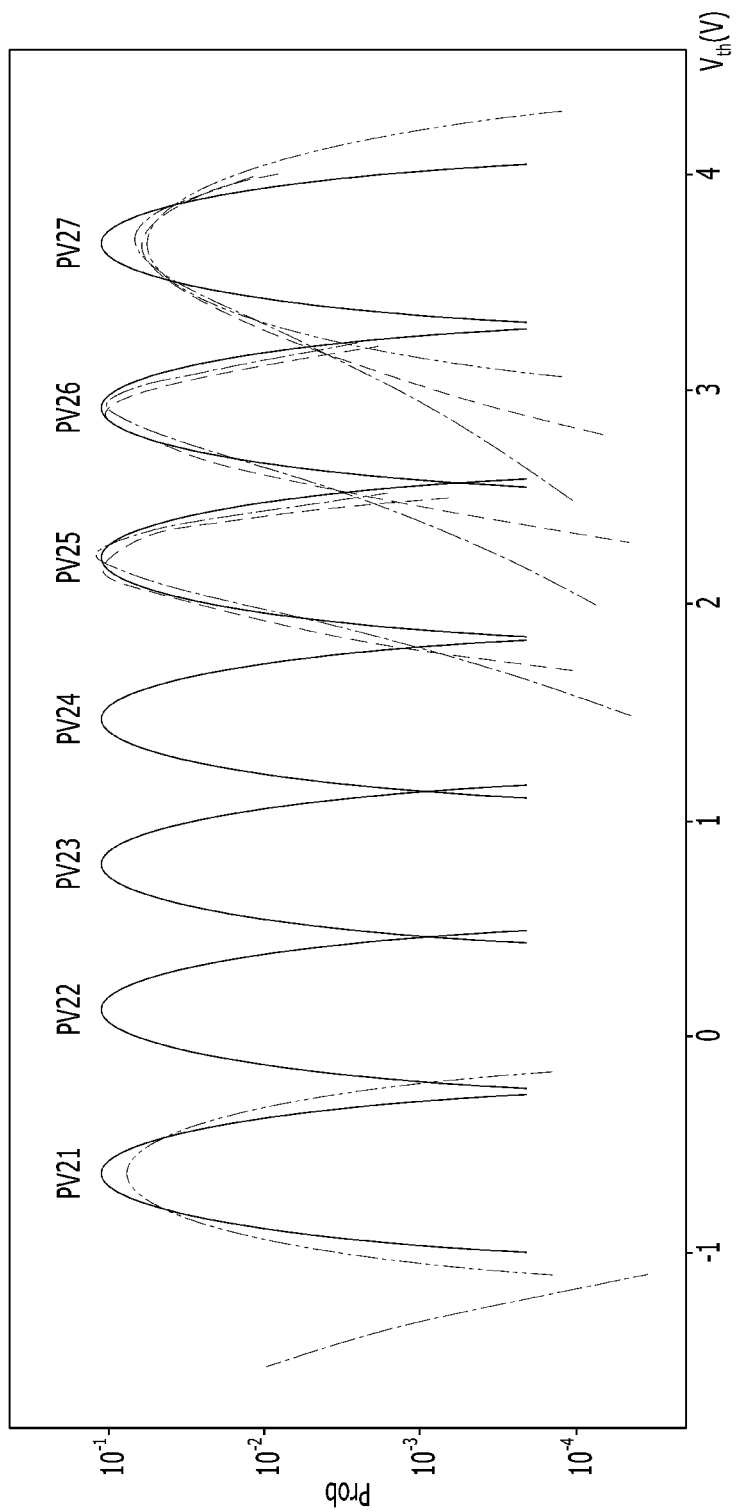
FIGS. 9A and 9B illustrate read threshold voltage (Vt) distributions of memory cells.
Figure 9B:
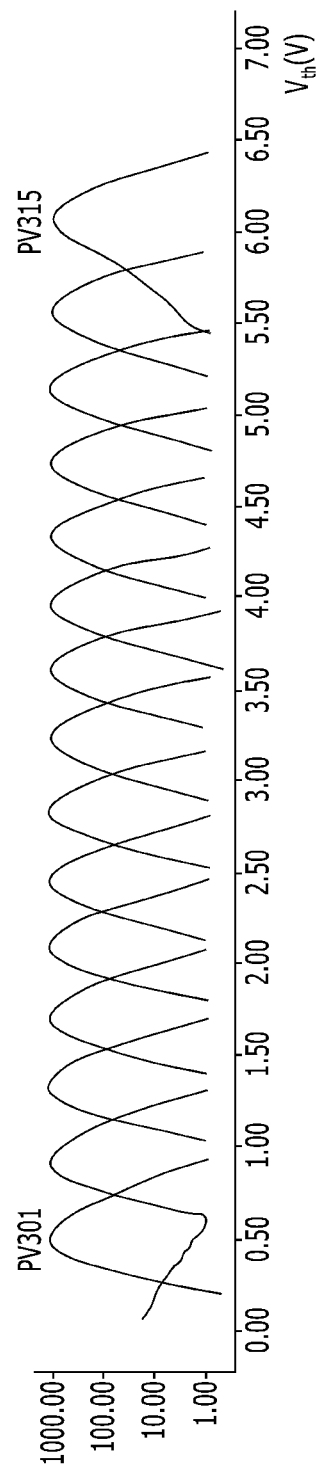

FIGS. 9A and 9B illustrate examples of threshold voltage (Vt) distributions or programmed states of a triple-level cell (TLC) and a quadruple-level cell (QLC), respectively.

One or more PV states may be asymmetric and have heavier tail(s) than others. In the example of FIG. 9A, three states PV25 to PV27 among PV21 to PV27 are asymmetric with heavy tails. In the example of FIG. 9B, the state PV315 among PV301 to PV315 is asymmetric with a heavy tail. In such cases, each of the existing algorithms described above may give a biased Vt estimation. Accordingly, it is desirable to provide a scheme for estimating a read threshold voltage in order to overcome the weakness of these existing algorithms.

Embodiments use deep learning and provide a parametric framework for program voltage or program verify (PV)-level modeling and optimal read threshold voltage (Vt) estimation.

Figure 10:
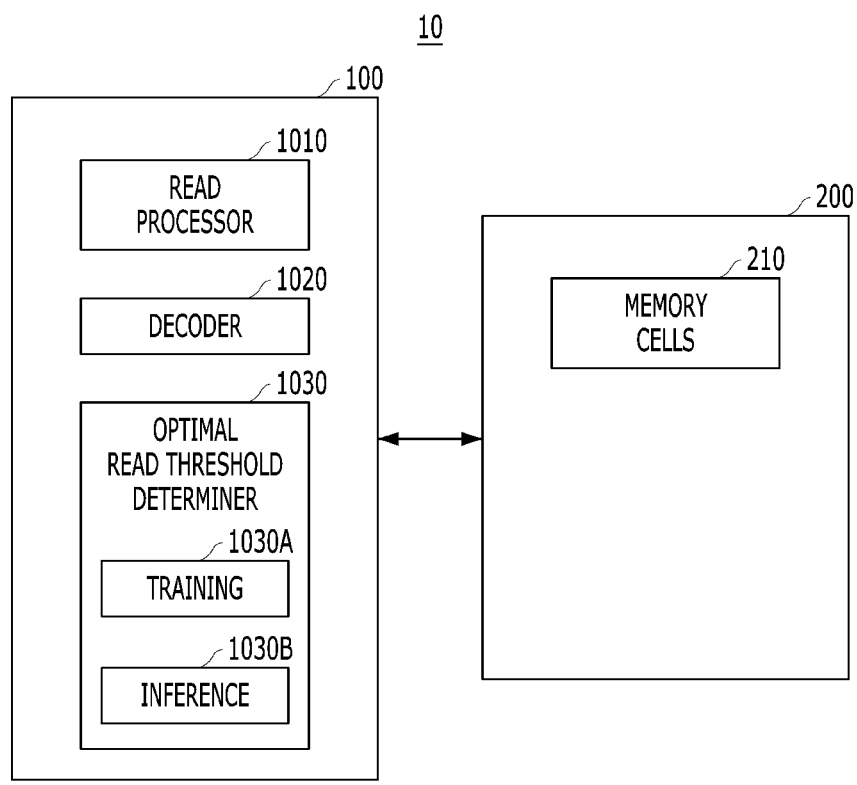
FIG. 10 is a diagram illustrating a memory system in accordance with an embodiment of the present invention.

FIG. 10 is a diagram illustrating a memory system 10 in accordance with an embodiment of the present invention.

Referring to FIG. 10, the memory system 10 may include a controller 100 and a memory device 200. The memory device 200 may include a plurality of memory cells (e.g., NAND flash memory cells) 210. The memory cells are arranged in an array of rows and columns as shown in FIG. 3. The cells in each row are connected to a word line (e.g., WL0), while the cells in each column are coupled to a bit line (e.g., BL0). These word and bit lines are used for read and write operations. During a write operation, the data to be written ('1' or '0') is provided at the bit line while the word line is asserted. During a read operation, the word line is again asserted, and the threshold voltage of each cell can then be acquired from the bit line. Multiple pages may share the memory cells that belong to (i.e., are coupled to) the same word line. When the memory cells are implemented with MLCs, the multiple pages include a most significant bit (MSB) page and a least significant bit (LSB) page. When the memory cells are implemented with TLCs, the multiple pages include an MSB page, a center significant bit (CSB) page and an LSB page. When the memory cells are implemented with QLCs, the multiple pages include an MSB page, a center most significant bit (CMSB) page, a center least significant bit (CLSB) page and an LSB page. The memory cells may be programmed using a coding scheme (e.g., Gray coding) in order to increase the capacity of the memory system 10 such as an SSD.

The controller 100 may include a read processor 1010, a decoder 1020 and an optimal read threshold determiner 1030. Although it is illustrated that these components of the controller 100 are implemented separately, one or more of these components may be embodied as an internal component (i.e., firmware (FW)) of the control component 120 in FIG. 2. Although not shown in FIG. 10, the controller 100 and the memory device 200 may include various other components as shown in FIG. 2.

The read processor 1010 may control one or more read operations for the memory device 200 in response to a read request from a host (e.g., the host 5 of FIG. 1). The read processor 1010 may control the read operations using various read thresholds. The decoder 1020 may decode data associated with the read operations.

In some embodiments, the read processor 1010 may control a read operation for the memory cells using a select read threshold from a set read level table. In some embodiments, the read level table may include multiple read thresholds, one of which may be a default read threshold. The select read threshold may be any of the multiple read thresholds in the read level table. When the read operation is performed for the MSB page of TLC, first and second read thresholds [VT0, VT4] as shown in FIG. 6B may be selected. The first read threshold value VT0 is used to distinguish between an erase state (i.e., E) and a first program state (i.e., PV1), and the second read threshold value VT4 is used to distinguish between a fourth program state (i.e., PV4) and a fifth program state (i.e., PV5). When the read operation is performed for the LSB page of TLC, first and second read thresholds [VT2, VT6] as shown in FIG. 6B may be selected. The first read threshold value VT2 is used to distinguish between a second program state (i.e., PV2) and a third program state (i.e., PV3), and the second read threshold value VT6 is used to distinguish between a sixth program state (i.e., PV6) and a seventh program state (i.e., PV7).

It may be determined whether the read operation using a read threshold selected from a read threshold set succeeded or failed, depending on the decoding result of the decoder 1020. When the read operation using the selected read threshold failed, the read processor 1010 may control one or more read retry operations for the memory cells using read retry entries, as shown in FIG. 7.

The optimal read threshold determiner 1030 may provide a parametric framework for a program voltage or program verify (PV)-level modeling and optimal read threshold voltage (Vt) estimation. The optimal read threshold determiner 1030 may be implemented with one or more deep neural networks (DNNs). For a parametric DNN framework, the optimal read threshold determiner 1030 may include a training component 1030A and an inference component 1030B.

Figure 11:
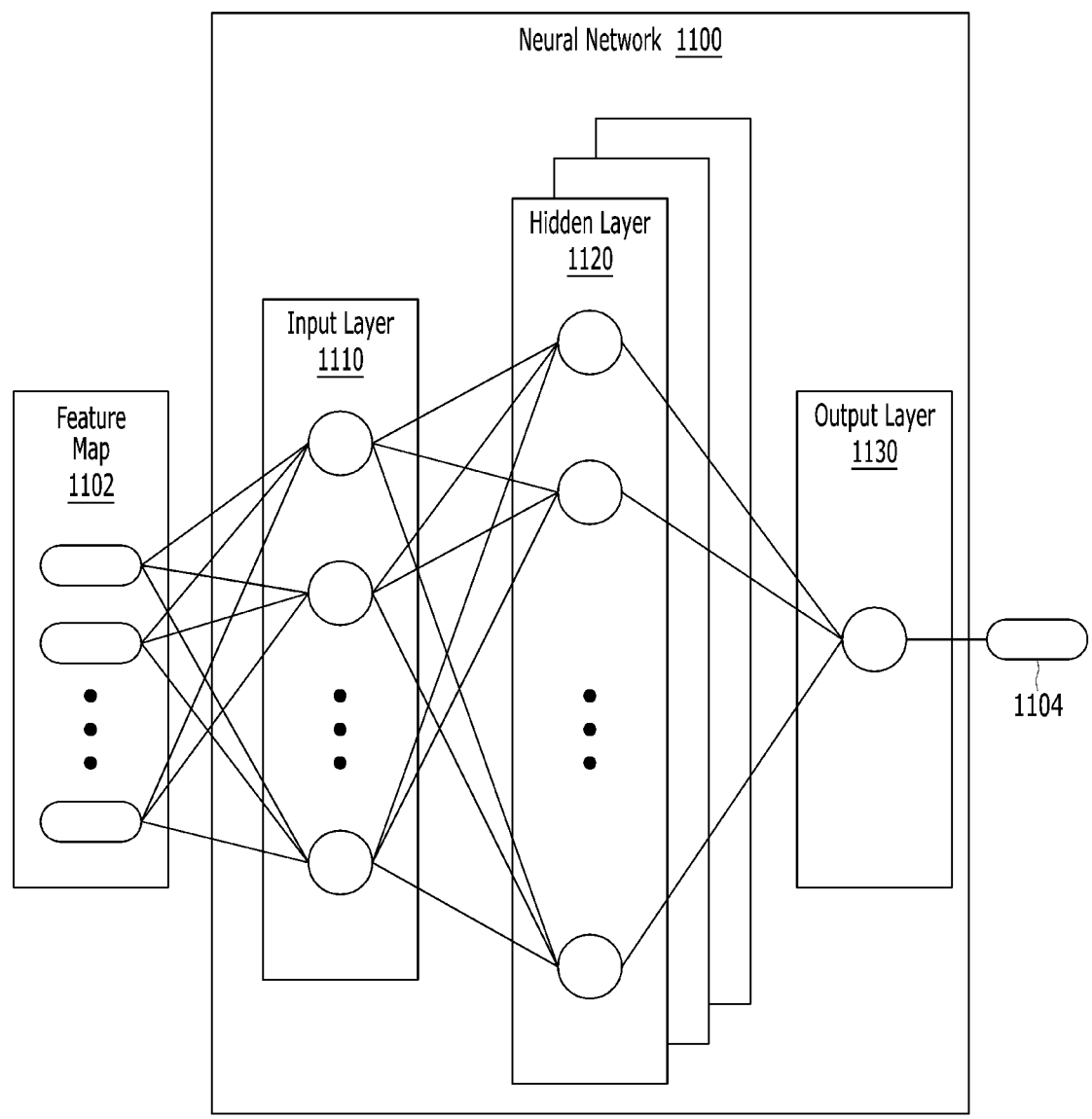
FIG. 11 is a diagram illustrating a neural network in accordance with an embodiment of the present invention.

FIG. 11 is a diagram illustrating an example of a neural network 1100 in accordance with an embodiment of the present invention. In some embodiments, the neural network 1100 may be included in the controller 100 of the memory system 10 in FIG. 10.

Referring to FIG. 11, a feature map 1102 associated with one or more input conditions may input to the neural network 1100. The feature map 1102 includes one or more features associated with one or more input conditions. The neural network 1100 uses the feature map 1102 to generate and output information 1104. As illustrated, the neural network 1100 includes an input layer 1110, one or more hidden layers 1120 and an output layer 1130. Features from the feature map 1102 may be connected to input nodes in the input layer 1110. The information 1104 may be generated from an output node of the output layer 1130. One or more hidden layers 1120 may exist between the input layer 1110 and the output layer 1130. The neural network 1100 may be pre-trained to process the features from the feature map 1102 through the different layers 1110, 1120, and 1130 in order to output the information 1104.

The neural network 1100 may be a multi-layer neural network that represents a network of interconnected nodes, such as an artificial deep neural network, where knowledge about the nodes (e.g., information about specific features represented by the nodes) is shared across layers and knowledge specific to each layer is also retained. Each node represents a piece of information. Knowledge may be exchanged between nodes through node-to-node interconnections. Input to the neural network 1100 may activate a set of nodes. In turn, this set of nodes may activate other nodes, thereby propagating knowledge about the input. This activation process may be repeated across other nodes until nodes in the output layer 1130 are selected and activated.

As illustrated, the neural network 1100 includes a hierarchy of layers representing a hierarchy of nodes interconnected in a feed-forward way. The input layer 1110 may exist at the lowest hierarchy level. The input layer 1110 may include a set of nodes that are referred to herein as input nodes. When the feature map 1102 is input to the neural network 1100, each of the input nodes of the input layer 1110 may be connected to each feature of the feature map 1102. Each of the connections may have a weight, each of which is derived from the training of the neural network 1100. The weights represent one set of parameters of the neural network 1100. The input nodes may transform the features by applying an activation function to these features. The information derived from the transformation may be passed to the nodes at a higher level of the hierarchy.

The output layer 1130 may exist at the highest hierarchy level. The output layer 1130 may include one or more output nodes. When the output layer 1130 outputs the output information 1104, each output node may provide a specific value of the output information 1104. Examples of the output information 1104 and the specific value of the output information 1104 are described in below. The number of output nodes depends on how many specific values of output information 1104 are needed. In other words, there is a one-to-one relationship or mapping between the number of output nodes and the number of values or pieces of output information 1104.

The hidden layer(s) 1120 may exist between the input layer 1110 and the output layer 1130. There may be N hidden layer(s) 1120, where "N" is an integer greater than or equal to one. Each of the hidden layers 1120 may include a set of nodes that are referred to herein as hidden nodes. Example hidden layers may include up-sampling, convolutional, fully connected layers, and/or data transformation layers.

At the lowest level of the hidden layer(s) 1120, hidden nodes of that layer may be interconnected to the input nodes. At the highest level of the hidden layer(s) 1120, hidden nodes of that level may be interconnected to the output node. The input nodes may be not directly interconnected to the output node(s). If multiple hidden layers exist, the input nodes are interconnected to hidden nodes of the lowest hidden layer. In turn, these hidden nodes are interconnected to the hidden nodes of the next hidden layer. An interconnection may represent a piece of information learned about the two interconnected nodes. The interconnection may have a numeric weight that can be tuned (e.g., based on a training dataset), rendering the neural network 1100 adaptive to inputs and capable of learning.

Generally, the hidden layer(s) 1120 may allow knowledge about the input nodes of the input layer 1110 to be shared among the output nodes of the output layer 1130. To do so, a transformation $f$ may be applied to the input nodes through the hidden layer 1120. In an example, the transformation $f$ is non-linear. Different non-linear transformations $f$ are available including, for instance, a rectifier function $f(x) = \max(0, x)$. In an example, a particular non-linear transformation $f$ is selected based on cross-validation.

For example, the neural network 1100 may be a deep learning neural network used for a memory system including a NAND flash memory device. The deep leaning neural network may be created with "K" input nodes and an output node, where "K" is the number of factors (e.g., features) that define input conditions for the memory system. The output node(s) may be used to perform an activation function for a certain combination of input conditions. The number of layers and size of each layer in the neural network 1100 may depend on the NAND flash memory device and an amount of the data that this memory can store.

Inventors observed that in some cases (e.g., curves indicated with PV26 and PV27 in FIG. 9A), cell-level distributions of a particular threshold voltage range corresponding to a PV level may be modeled by a skew normal distribution. Generally, a skew normal distribution is defined as a continuous probability distribution that generalizes the normal distribution to allow for non-zero skewness. Each cumulative distribution function (CDF) value may represent a skew normal distribution model of a particular PV level. To describe characteristics of a skew normal distribution, probability distribution parameters may include location ξ, scale ω, and shape α, which may collectively be considered a set of parameters.

Figure 12:
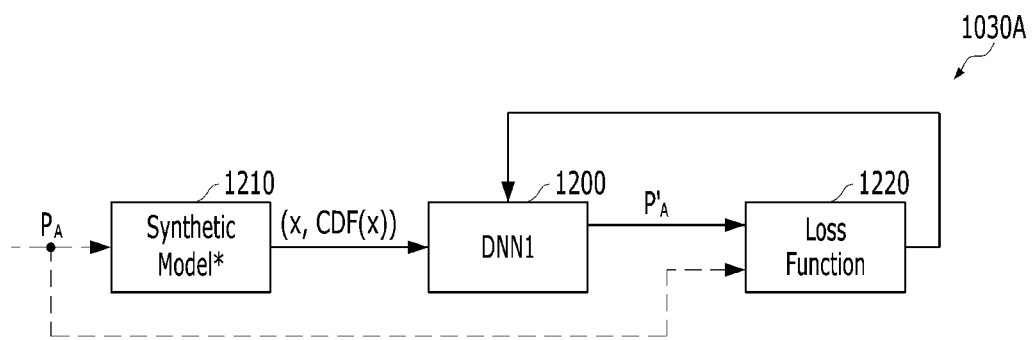
FIG. 12 is a diagram illustrating a training component in accordance with an embodiment of the present invention.

In some embodiments, the neural network 1100 may be a first deep neural network (DNN1) or a second deep neural network (DNN2) in FIGS. 12 and/or 13. As input condition(s), DNN1 may receive one or more CDF values of samples corresponding to read operations and may output probability distribution parameters as output information 1104. For example, the neural network 1100 (e.g., DNN1) may be pre-trained to process the features (i.e., CDF values) from the feature map 1102 through the different layers 1110, 1120, and 1130 in order to output the probability distribution parameters 1104. As input condition(s), DNN2 may receive one or more probability distribution parameters and output probability density function (PDF) values as output information 1104.

FIG. 12 is a diagram illustrating a training component 1030A in accordance with an embodiment of the present invention.

Referring to FIG. 12, the training component 1030A may include a synthetic model 1210 to train a first deep neural network (DNN1) 1200. To train DNN1 1200, synthetic dataset (or data) may be collected by the synthetic model 1210. The synthetic dataset may be any production data applicable to a given situation that are not obtained by direct measurement from a memory device (e.g., a NAND flash memory device). In some embodiments, the deep neural network 1200 may be used for a memory system including a NAND flash memory device. As described above, threshold voltage (Vt) distributions (i.e., PV levels) of memory cells may be modeled by a parametric distribution (i.e., a skew normal distribution). A skew normal distribution is characterized by the cumulative distribution function (CDF) as represented as below:

$$CDF(x) = \Phi\left(\frac{x-\xi}{\omega}\right) - 2T\left(\frac{x-\xi}{\omega}, \alpha\right)$$
$T(h, a)$ is Owen's T function $$T(h, a) = \frac{1}{2\pi}\int_0^a \frac{e^{-\frac{1}{2}h^2(1+x^2)}}{1+x^2}dx \quad (-\infty < h, a < +\infty).$$

As expressed in Equation above, a skew normal distribution has 3 parameters, namely location scale w and shape a. In other words, for a read threshold voltage range corresponding to each PV level, 3 probability distribution parameters may be used to describe the probability distribution for each PV level. In Equation above, x represents a sampling read threshold voltage (i.e., PV level) and T(h, a) defines Owen's T function.

The synthetic model 1210 may generate synthetic dataset (x, CDF(x)) based on probability distribution parameters p, which collectively represent 3 parameters (i.e., w and a). DNN1 1200 may be trained on the synthetic dataset that includes CDF values CDF(x) from the parametric distributions at the various sampling voltages x, and output probability distribution parameters p' as the training result. The probability distribution parameters p' may be used to determine the characteristics of a voltage range curve for a memory cell.

Training result generated by DNN1 1200 may be provided to a loss function component 1220. The loss function component 1220 may use a loss function (or a cost function) to find an optimal solution for trained probability distribution parameters p'. DNN1 1200 may be trained to refine the probability distribution parameters such that the difference (or error) between actual probability distribution parameters p of the synthetic model 1210 and the predicted probability distribution parameters p' by DNN1 1200 is minimized.

As such, the relationship between CDF values CDF(x) and probability distribution parameters Θ may be trained by DNN1 1200. Once trained, training results may be used by the inference component 1030B.

Figure 13:
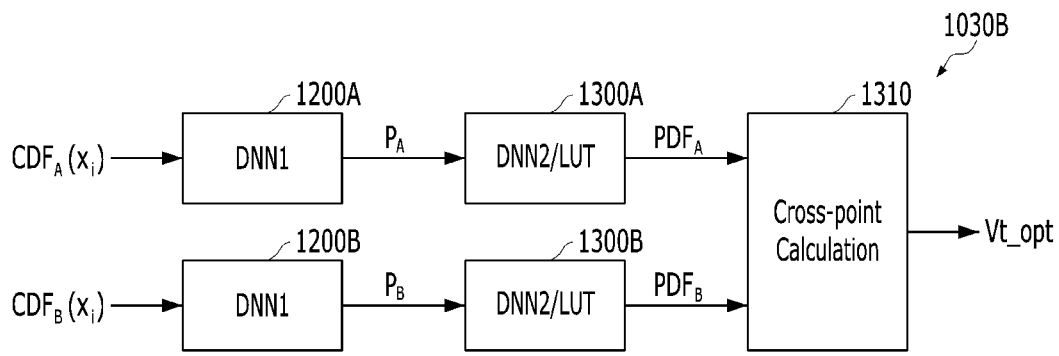
FIG. 13 is a diagram illustrating an inference component in accordance with an embodiment of the present invention.

FIG. 13 is a diagram illustrating an inference component 1030B in accordance with an embodiment of the present invention.

Referring to FIG. 13, the inference component 1030B may include first deep neural networks (DNN1) 1200A, 1200B, second deep neural networks (DNN2) 1300A,1300B and a cross-point calculation component 1310. Each DNN1 1200A,1200B may be trained as shown in FIG. 12. Each of DNN1 and DNN2 may be implemented in SoC or FW depending on the size of the DNN used.

In FIG. 13, $PV_A$ and $PV_B$ (e.g., 1502 and 1504 in FIG. 15) represent two adjacent PV voltage levels. $CDF_A(x_i)$ represents $PV_A$'s CDF value of the threshold voltage distribution sampled at voltage $x_i$. $CDF_B(x_i)$ represents $PV_B$'s CDF value of the threshold voltage distribution sampled at voltage $x_i$. $p_A$ represents probability distribution parameters of $PV_A$. $p_B$ represents probability distribution parameters of $PV_B$. Optimal read threshold voltage Vt_opt represents the cross-point voltage between the threshold voltage distributions of $PV_A$ and $PV_B$.

Threshold voltage distributions of cells in a PV level may be modeled by a parametric distribution (i.e., skew normal distribution). The parametric distribution models the relationship between the CDF value and probability distribution parameters p for each PV level. Skew normal distributions of $PV_A$ and $PV_B$ are modeled with probability distribution parameters $p_A$ and $p_B$, respectively.

For an n-bit multi-level cell NAND flash memory, a threshold voltage of each cell can be programmed to $2^n$ possible values. In an ideal multi-level cell NAND flash memory, each value falls within a non-overlapping threshold voltage range. However, in many systems due to operational conditions, adjacent threshold voltage ranges for respective values may partially overlap. An example of this overlap is illustrated in FIGS. 8 to 9B.

DNN1 1200A may receive a first CDF value $CDF_A(x_i)$ that represents a skew normal distribution model of a first threshold voltage range. The first CDF $CDF_A(x_i)$ may be generated by iterative modeling to determine a parametric representation of the threshold voltage range, as shown in FIG. 12. The first CDF value $CDF_A(x_i)$ may correspond to a first level of the multi-level cell NAND-flash memory. Each multi-level cell has multiple levels based on how many bits are stored in a cell. In one example, a triple level cell (TLC) stores three bits per multi-level cell and has $2^n$ levels, or eight levels. Each of the eight levels of the three-bit TLC correspond to a voltage range that can be represented by the first CDF value $CDF_A(x_i)$. DNN1 1200B may receive a second CDF value $CDF_B(x_i)$ that represents a skew normal distribution model of a second threshold voltage range. The second CDF value $CDF_B(x_i)$ may correspond to a second level of the multi-level cell.

Each DNN1 1200A, 1200B may estimate probability distribution parameters p based on a CDF value, which is given through measurement of memory cells. For example, DNN1 1200A may estimate probability distribution parameters $p_A$ based on the first CDF value $CDF_A(x_i)$. DNN1 1200B may estimate probability distribution parameters $p_B$ based on the second CDF sample $CDF_B(x)$. Probability distribution parameters are expressed as $p_A=(\xi_A, \omega_A, \alpha_A)$ and $p_B=(\xi_B, \omega_B, \alpha_B)$.

Each DNN2 1300A, 1300B may determine PDF values of the distributions for various candidate read threshold voltages based on the estimated probability distribution parameters p. For example, DNN2 1300A may receive the estimated probability distribution parameters $p_A$ and determine PDF values $PDF_A$ based on the estimated probability distribution parameters $p_A$. DNN2 1300B may receive the estimated probability distribution parameters $p_B$ and determine PDF values $PDF_B$ based on the estimated probability distribution parameters $p_B$. In some embodiments, each DNN2 1300A, 1300B may determine PDF values of the distributions for various candidate read threshold voltages based on the estimated probability distribution parameters p, by using the following equation:

$$PDF(x) = \frac{2}{\omega\sqrt{2\pi}} e^{-\frac{(x-\xi)^2}{2\omega^2}} \int_{-\infty}^{\alpha\left(\frac{x-\xi}{\omega}\right)} \frac{1}{\sqrt{2\pi}} e^{-\frac{t^2}{2}} dt,$$

wherein ξ represents location, ω represents scale and α represents shape, which are the probability distribution parameters p.

In some embodiments, each DNN2 1300A, 1300B may include a look-up table (LUT), which stores the relationship between probability distribution parameters and PDF values.

The cross-point calculation component 1310 may find two candidate read threshold voltages which produces approximately equal PDF values. Further, the cross-point calculation component 1310 may determine the cross-point of the two candidate read threshold voltages as the optimal read threshold voltage Vt_opt.

As such, the inference component 1030B may estimate the cross-point (intersection) of underlying PDF values based on a few noisy samples of CDF values.

Figure 14:
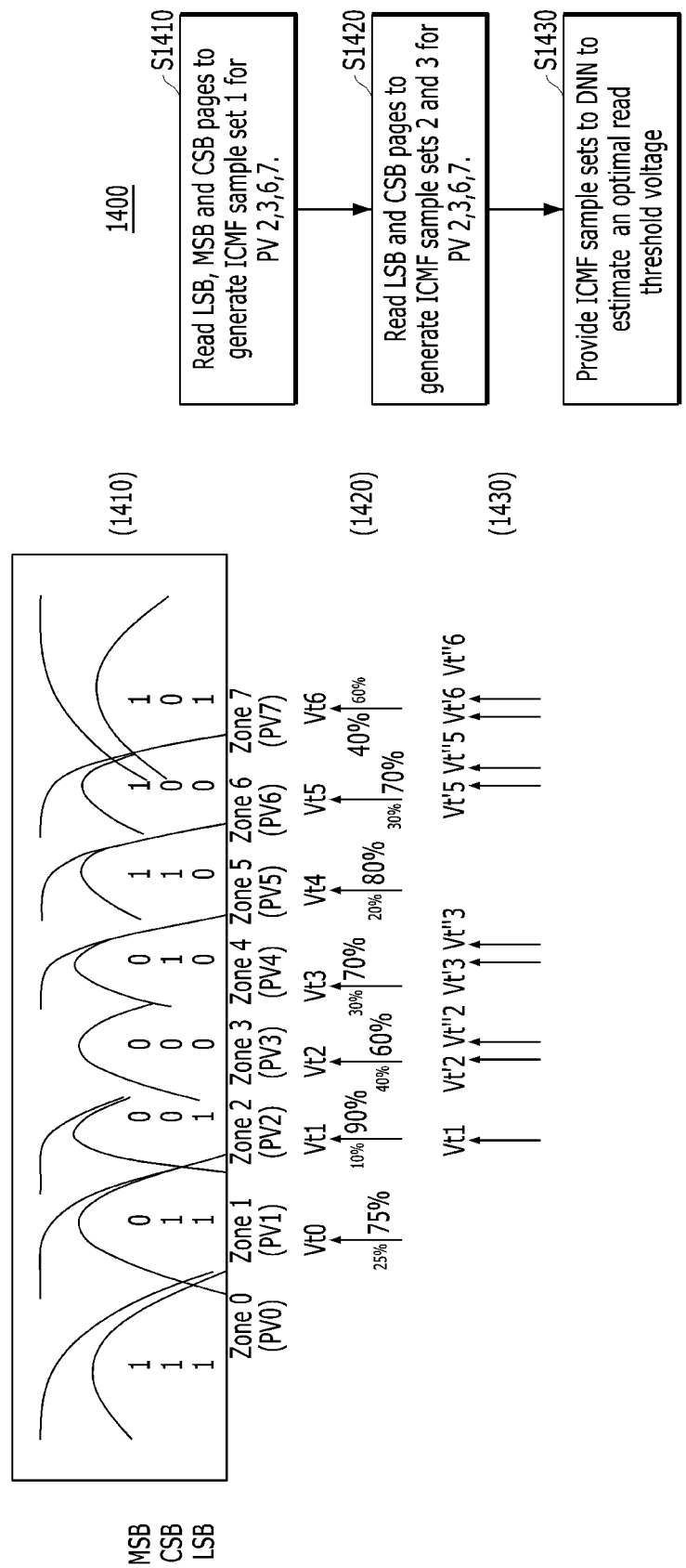
FIG. 14 illustrates an operation for determining an optimal read threshold voltage in accordance with an embodiment of the present invention.

FIG. 14 illustrates an operation for obtaining ICMF samples to be used for estimating an optimal read threshold voltage in accordance with an embodiment of the present invention. This operation may be performed by the read processor 1010 of the controller 100 in FIG. 10. By way of example, ICMF samples may be obtained in order to estimate an optimal read threshold voltage for an LSB page of TLC.

In FIG. 14, 1410 represents parametric distributions corresponding to threshold voltage distributions of PV levels of TLC, as shown in FIG. 6A. As illustrated, the distributions of a TLC include 8 zones including Zone 0 to Zone 7 and each zone corresponds to a program states or a PV level.

At operation S1410, the controller 100 may read LSB, MSB and CSB pages to generate PV state counts. Further, the controller 100 may generate a first ICMF sample set for PV 2,3,6,7 based on the PV state counts. Here, ICMF means the inverse of a cumulative mass function (CMF). In some embodiments, for each read threshold voltage, a cumulative mass function (CMF) value may be determined based on number of cells (cell count) and the number of a particular binary value (1 or 0) among the cells, which are associated with a read operation using each read threshold voltage. For example, each CMF value may be determined as {the number of 1's or 0's (e.g., 1's)/cell count}, i.e., the percentage of 1's or 0's.

1420 represents the first ICMF sample set for PV 2,3,6,7, which is generated at S1410. Samples for each page in the first ICMF sample set are generated from the parametric distributions at various read threshold voltages. In the illustrated example, for MSB pages, ICMF samples are generated at read threshold voltages Vt0, Vt4. The ICMF sample at the read threshold voltages Vt0 includes 75% 1's and 25% 0's, and the ICMF sample at the read threshold voltages Vt4 includes 80% 1's and 20% 0's. For CSB pages, ICMF samples are generated at read threshold voltages Vt1, Vt3, Vt5. The ICMF sample at the read threshold voltages Vt1 includes 10% 1's and 90% 0's, the ICMF sample at the read threshold voltages Vt3 includes 30% 0's and 70% 1's and the ICMF sample at the read threshold voltages Vt5 includes 30% 1's and 70% 0's. For LSB pages, ICMF samples are generated at read threshold voltages Vt2, Vt6. The ICMF sample at the read threshold voltages Vt2 includes 40% 1's and 60% 0's, and the ICMF sample at the read threshold voltages Vt6 includes 40% 0's and 60% 1's.

At operation S1420, the controller 100 may read one or more LSB and CSB pages to generate second and third ICMF sample sets for PV 2,3,6,7. In the illustrated embodiment in 1430, 2 LSB and CSB pages may be read. This embodiment considers distributions based on skew normal model (SNM). The number of LSB and CSB pages to be read may vary according to distribution model. For distributions of improved Gaussian model (IGM), 1 LSB and CSB pages may be read. For distributions of non-central model (NCTM), 3 LSB and CSB pages may be read.

1430 represents the second and third ICMF sample sets for PV 2,3,6,7, which is generated at S1420. Samples for each page in the second ICMF sample set are generated from the parametric distributions at various read threshold voltages. In the illustrated example, for CSB pages, ICMF samples are generated at read threshold voltages Vt'3, Vt'5. For LSB pages, ICMF samples are generated at read threshold voltages Vt'2, Vt'6. Samples for each page in the third ICMF sample set are generated from the parametric distributions at various read threshold voltages. In the illustrated example, for CSB pages, ICMF samples are generated at read threshold voltages Vt"3, Vt"5. For LSB pages, ICMF samples are generated at read threshold voltages Vt"2, Vt"6. Although not illustrated, each ICMF sample of the second and third ICMF sample sets indicate a percentage of 0's and a percentage of 1's.

As such, the operations S1410 and S1420 are performed to estimate distributions for a particular page (i.e., LSB page) and to eliminate other components (e.g., noise). At operation S1430, the controller 100 may provide the ICMF samples to DNN1 1200A,1200B in order to estimate an optimal read threshold voltage. In some embodiments, CDF values corresponding to the ICMF samples (or CMF samples) may be provided to DNN1 1200A,1200B, as shown in FIG. 13B.

Figure 15:
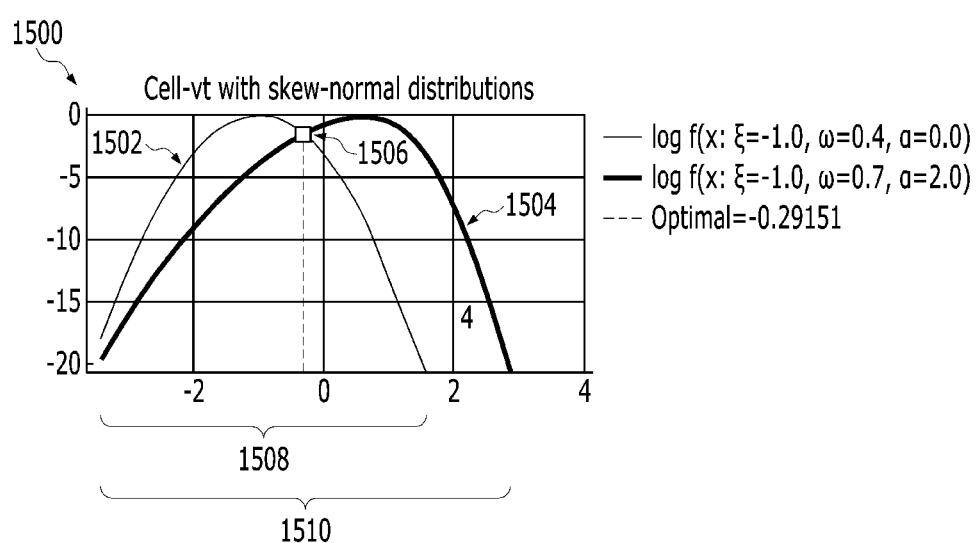
FIG. 15 illustrates a graph of an example optimal read threshold voltage determined for two distribution curves in accordance with an embodiment of the present invention.

FIG. 15 illustrates a graph 1500 of an example voltage read threshold generated according to an embodiment of the present invention.

Referring to FIG. 15, graph 1500 depicts a first curve 1502 that represents a probability distribution of the first voltage range 1508 and a second curve 1504 that represents the second voltage range 1510. An optimal read threshold voltage (i.e., −0.29151) 1506 is determined as the cross-point (intersection) between the first voltage range 1508 and the second voltage range 1510, which is illustrated by the intersection of the first curve 1502 and the second curve 1504. In the illustrated example of FIG. 15, the first curve 1502 and the second curve 1504 depict logarithmic functions of probability distribution parameters $p=(\xi, \omega, \alpha)$ in two voltage ranges. Each of the first voltage range 1508 and the second voltage range 1510 are modelled by a set of skew normal distribution parameters, which are shown in the legend of graph 1500.

As described above, embodiments provide a scheme for parametric PV-level modeling and optimal read threshold voltage estimation. Embodiments model threshold voltage distributions of memory cells as a parametric distribution (i.e., a skew normal distribution) and estimate an optimal read threshold voltage based on the parametric distribution. Thus, embodiments improve reliability of a read operation for any PV state that is asymmetric and has heavier tail.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A memory system comprising:
a memory device including a plurality of cells; and
a controller configured to:
perform read operations on the cells using a plurality of read threshold voltages;
generate cumulative mass function (CMF) samples based on the results of the read operations;
receive first and second cumulative distribution function (CDF) values, selected from among a plurality of CDF values, which correspond to the CMF samples, each of the first and second CDF values representing a skew normal distribution;
estimate first and second probability distribution parameter sets corresponding to the first and second CDF values, respectively;
determine first and second probability density function (PDF) values corresponding to the first and second CDF values using the first and second probability distribution parameter sets, respectively; and
estimate, as an optimal read threshold voltage, a read threshold voltage corresponding to a cross-point of the first and second PDF values.

2. The memory system of claim 1, wherein the controller is further configured to perform a next read operation on the cells using the optimal read threshold voltage.

3. The memory system of claim 1, wherein each CMF sample has a specific percentage of a particular binary value of data stored in the cells.

4. The memory system of claim 3, wherein each of the first and second probability distribution parameter sets include location, scale and shape of a curve associated with the skew normal distribution.

5. The memory system of claim 3, wherein each of the first and second probability distribution parameter sets is estimated by a neural network, which is trained to output multiple probability distribution parameter sets corresponding to multiple CDF values, respectively.

6. The memory system of claim 5, wherein the neural network is trained to receive each of the multiple CDF values and output each of the multiple probability distribution parameter sets based on a synthetic model.

7. The memory system of claim 3, wherein each of the first and second PDF values is determined by a neural network, which is trained to receive the first and second probability distribution parameter sets and output the first and second PDF values corresponding to the first and second probability distribution parameter sets, respectively.

8. The memory system of claim 3, wherein the first PDF value is the same as the second PDF value.

9. The memory system of claim 8, wherein the optimal read threshold voltage corresponds to a cross-point of a first read threshold voltage having the first PDF value and a second read threshold voltage having the second PDF value.

10. A method for operating a memory system including a memory device including a plurality of cells and a controller, the method comprising:
- performing read operations on the cells using a plurality of read threshold voltages;
- generating cumulative mass function (CMF) samples based on the results of the read operations;
- receiving first and second cumulative distribution function (CDF) values, selected from among a plurality of CDF values, which correspond to the CMF samples, each of the first and second CDF values representing a skew normal distribution;
- estimating first and second probability distribution parameter sets corresponding to the first and second CDF values, respectively;
- determining first and second probability density function (PDF) values corresponding to the first and second CDF values using the first and second probability distribution parameter sets, respectively; and
- estimating, as an optimal read threshold voltage, a read threshold voltage corresponding to a cross-point of the first and second PDF values.

11. The method of claim 10, wherein further comprising: performing a next read operation on the cells using the optimal read threshold voltage.

12. The method of claim 10, wherein each CMF sample has specific percentage of a particular binary value of data stored in the cells.

13. The method of claim 12, wherein each of the first and second probability distribution parameter sets include location, scale and shape of a curve associated with the skew normal distribution.

14. The method of claim 12, wherein each of the first and second probability distribution parameter sets is estimated by a neural network, which is trained to output multiple probability distribution parameter sets corresponding to multiple CDF values, respectively.

15. The method of claim 14, wherein the neural network is trained to receive each of the multiple CDF values and output each of the multiple probability distribution parameter sets based on a synthetic model.

16. The memory system of claim 12, wherein each of the first and second PDF values is determined by a neural network, which is trained to receive the first and second probability distribution parameter sets and output the first and second PDF values corresponding to the first and second probability distribution parameter sets, respectively.

17. The method of claim 12, wherein the first PDF value is the same as the second PDF value.

18. The method of claim 17, wherein the optimal read threshold voltage corresponds to a cross-point of a first read threshold voltage having the first PDF value and a second read threshold voltage having the second PDF value.

* * * * *